(12) United States Patent
Inoue et al.

(10) Patent No.: US 8,207,066 B2
(45) Date of Patent: Jun. 26, 2012

(54) DRY ETCHING METHOD

(75) Inventors: Yoshiharu Inoue, Kudamatsu (JP);
Hiroaki Ishimura, Kudamatsu (JP);
Hitoshi Kobayashi, Kudamatsu (JP);
Masunori Ishihara, Kudamatsu (JP);
Toru Ito, Kudamatsu (JP); Toshiaki Nishida, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 159 days.

(21) Appl. No.: 12/512,094

(22) Filed: Jul. 30, 2009

(65) Prior Publication Data
US 2010/0255612 A1 Oct. 7, 2010

(30) Foreign Application Priority Data
Apr. 1, 2009 (JP) .................................. 2009-089103

(51) Int. Cl.
*H01L 21/00* (2006.01)
*H01L 21/302* (2006.01)
*H01L 21/461* (2006.01)

(52) U.S. Cl. ........ 438/714; 438/706; 438/710; 438/719; 438/5; 257/E21.218; 257/E21.529

(58) Field of Classification Search .................. 438/706, 438/710, 714, 719; 257/E21.218, E21.529
See application file for complete search history.

(56) References Cited

U.S. PATENT DOCUMENTS

| 5,302,236 A | 4/1994 | Tahara et al. |
| 5,356,515 A | 10/1994 | Tahara et al. |
| 6,080,681 A | 6/2000 | Tabara |
| 2010/0178770 A1 * | 7/2010 | Zin .............................. 438/694 |

FOREIGN PATENT DOCUMENTS

| JP | 2001-053138 | 2/2001 |
| JP | 2004-507086 | 3/2004 |
| KR | 1999-003156 | 1/1999 |
| KR | 100257149 | 5/2000 |
| WO | WO 02/15249 A2 | 2/2002 |

* cited by examiner

*Primary Examiner* — Seahvosh Nikmanesh
(74) *Attorney, Agent, or Firm* — Antonelli, Terry, Stout & Kraus, LLP.

(57) ABSTRACT

The invention provides a dry etching method capable of obtaining a good profile with little side etch without receiving the restriction of a micro loading effect. A dry etching method for etching a sample having formed on the surface thereof a pattern with an isolated portion and a dense portion using plasma comprises a first etching step using an etching gas containing a CF-based gas and a nitrogen gas in which an etching rate of a dense portion of the pattern is greater than the etching rate of the isolated portion of the mask pattern, and a second etching step in which the etching rate of the isolated portion of the pattern is greater than the etching rate of the dense portion of the pattern.

9 Claims, 6 Drawing Sheets

DRY ETCHING METHOD

The present application is based on and claims priority of Japanese patent application No. 2009-089103 filed on Apr. 1, 2009, the entire contents of which are hereby incorporated by reference.

BACKGROUND OF THE INVENTION

1. Field of the Invention

The present invention relates to a dry etching method, and more specifically, to a dry etching method of a silicon substrate for manufacturing semiconductor devices.

2. Description of the Related Art

Recently in the field of semiconductor devices, along with the advancement of low power consumption, improved operation speed and higher integration, one of the problems to be solved is the isolation of semiconductor elements and the securing of memory/cell capacity area. One of the methods for solving the problem is a process for forming trenches on a silicon substrate, wherein element isolation is realized by a method called a shallow trench isolation method (hereinafter referred to as STI method).

The STI method is composed of a process for forming trenches on a semiconductor substrate, and a process for embedding insulating films into the trenches and planarizing the same. Thus, in order to perform element isolation via the STI method, it is necessary to first form trenches on the semiconductor substrate.

Usually according to a photolithography method and etching method, a resist pattern is formed, and the patterned resist is used as a mask to perform etching. However, in order to etch a hard layer such as a substrate on which the trenches are formed (what is meant by "hard" is that the material has a relatively small etching rate with respect to common materials to be etched), the resist itself is weak, and therefore, it cannot be used alone as mask. Therefore, an etching mask so-called a hard mask, such as a nitride film or an oxide film, is used.

The hard mask must also be patterned through a photolithography method and etching method. With the resist remaining on the hared mask, or after removing the resist, the hard mask is used to form trenches on the semiconductor substrate. After forming trenches, an insulating film such as a silicon oxide film is embedded in the trenches via a CVD method or the like, and therefore, a process of planarizing the surface of the substrate is performed via a chemical mechanical polishing (CMP) method, by which the STI method is realized.

Figure 4A:
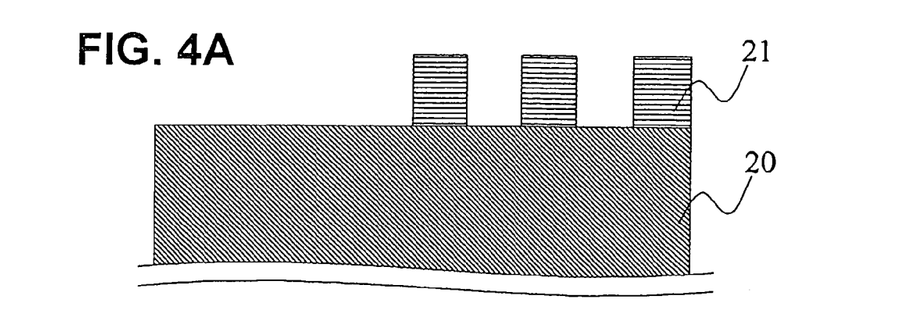
FIG. 4A is a vertical cross-sectional view of a silicon substrate showing the state prior to performing etching of an etching step in which a micro loading effect occurs.
Figure 4B:
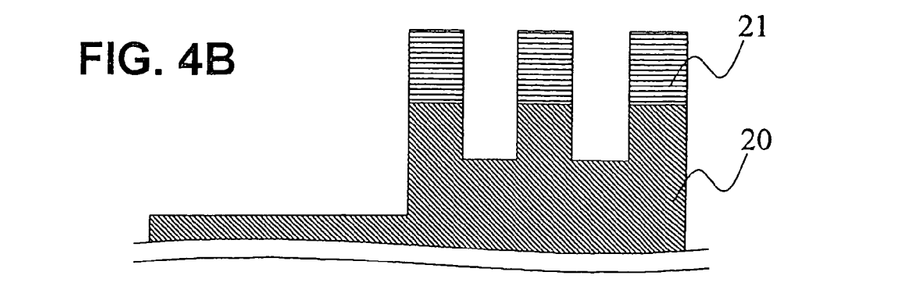
FIG. 4B is a vertical cross-sectional view of a silicon substrate showing the state after performing etching of an etching step in which a micro loading effect occurs.
Figure 5:
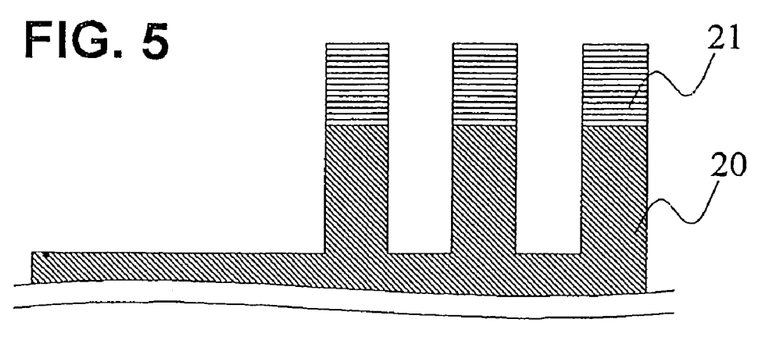
FIG. 5 is a cross-sectional view of a silicon substrate after completing etching according to the etching method of the present invention.

According to the STI method performed in the above manner, when etching a wafer having a patterned mask 21 disposed on a silicon substrate 20 as illustrated in FIG. 4A, the portion where the dimension width (or area) exposing the silicon as substrate material is narrow (portion where the mask pattern is dense) has a lower etching rate than a wider portion (portion where the mask pattern is isolated), which is a so-called micro loading effect. As a result, as shown in FIG. 4B, the present micro loading effect causes the amount of etching of the portion where the pattern is dense to be smaller than the amount of etching of the portion where the pattern is isolated, so that it is difficult to form trenches with a desired depth.

The mechanism of the micro loading effect is considered to be caused mainly by the difference in the amount of radicals being incident per unit time on the portion where the mask pattern is isolated and on the portion where the mask pattern is dense (since radicals are capable of isotropic free motion). That is, in the portion where the mask pattern is dense, the incidence of radicals is blocked by the surrounding mask, so that the etching rate is extremely lowered compared to where the mask pattern is isolated.

One method for solving the problem is disclosed in Japanese patent application laid-open publication No. 2001-053138 (patent document 1). The disclosed art relates to implanting inactive ions into a portion where silicon is exposed prior to etching the silicon substrate, turning a portion thereof into amorphous and mainly etching said portion. Since according to the method the ions realize anisotropic incidence, the mask pattern has very little isolated-dense dependency during etching (here, what is meant by the mask pattern being isolated or dense is that abstract concepts of the property that the mask pattern is "isolated" or that the mask pattern is "dense" are extracted). Therefore, only the portions that must be etched intrinsically is turned into amorphous and removed.

Another art is disclosed in published Japanese translations of PCT international publication No. 2004-507086 (patent document 2), according to which a resist mask is removed prior to etching the silicon substrate, and the aspect ratio between patterns is reduced, so that anisotropic etching is performed via ion assisted etching.

SUMMARY OF THE INVENTION

Though the above-mentioned prior arts may achieve a certain level of improvement, since they perform etching by mainly utilizing the anisotropic incidence of charged particles, the limitation due to the micro loading effect cannot be completely eliminated, and further, they lack to sufficiently consider cases where the aspect ratio is higher, so that they cannot ignore the rate components of the incident rate of ions parallel to the wafer plane, and the limitation due to the micro loading effect still becomes a problem.

Therefore, in order to perform etching with higher accuracy, it is necessary to solve the limitations due to the micro loading effect.

The present invention aims at solving the problems of the prior art by providing a dry etching method for etching a wafer having a mask pattern including an isolated portion and a dense portion, capable of obtaining a preferable profile with little side etch without being affected by the limitation of the micro loading effect.

The above-mentioned object of the present invention is achieved by a dry etching method for etching using plasma a sample having a mask pattern including an isolated portion and a dense portion, the method comprising an anti-micro loading etching step (hereinafter also referred to as a first etching step) in which an etching rate of the dense portion of the pattern is greater than the etching rate of the isolated portion of the pattern, and a micro loading step (hereinafter also referred to as a second etching step) in which the etching rate of the isolated portion of the pattern is greater than the etching rate of the dense portion of the pattern. In the present specification, the terms "first" and "second" in the first etching step and the second etching step do not necessary refer to the order in which the steps are to be performed.

In other words, the present invention provides a dry etching method for etching using plasma a sample wafer having formed on a silicon substrate a mask pattern having at least a single layer and including an isolated portion and a dense portion, the method comprising a first etching step in which an etching rate of the dense portion of the pattern is greater than the etching rate of the isolated portion of the pattern, and a second etching step in which the etching rate of the isolated portion of the pattern is greater than the etching rate of the dense portion of the pattern.

The present invention provides a dry etching method for etching using plasma a sample wafer having formed on a silicon substrate a mask pattern having at least a single layer and including an isolated portion and a dense portion, the method comprising a first etching step in which an etching rate of the dense portion of the pattern is greater than the etching rate of the isolated portion of the pattern, and a second etching step in which the etching rate of the isolated portion of the pattern is greater than the etching rate of the dense portion of the mask pattern, wherein the first etching step uses a mixed gas composed of a CF-based gas and a gas containing nitrogen atoms, and an etching depth of the isolated portion and the dense portion of the pattern is set to a predetermined value by selecting an etching time ratio of the first etching step and the second etching step.

The present invention provides the above-mentioned dry etching method, wherein the first etching step uses a mixed gas composed of a CF-based gas, a gas containing nitrogen atoms and a gas containing oxygen atoms.

According further to the present invention, in the first etching step, a flow rate of the gas containing nitrogen atoms is controlled to fall within a range of 10 to 50% of the flow rate of the CF-based gas.

According further to the present invention, in the first etching step, the flow rate of the gas containing oxygen atoms is controlled to be equal to or smaller than the flow rate of nitrogen gas.

According to the present invention, the processing pressure according to the first etching step is controlled to fall within a range of 0.2 to 3 Pa.

The present invention provides the above-mentioned dry etching method, wherein the first etching step is an etching step in which a anti-micro loading effect occurs, the second etching step is an etching step in which a micro loading effect occurs, and the first and second etching steps are performed alternately.

The present invention provides the above-mentioned dry etching method, wherein the first etching step is an etching step using a mixed gas composed of a CF-based gas and a gas containing nitrogen atoms, and the second etching step is an etching step using halogen gas.

The present invention provides a dry etching method for etching using plasma a sample wafer having formed on a silicon substrate a mask pattern having at least a single layer and including an isolated portion and a dense portion, the method comprising a first etching step in which a deposition rate via depositors is greater than an etching rate via etchants in the isolated portion, and a second etching step in which the etching rate via etchants is greater than the deposition rate via depositors in the isolated portion.

The present invention provides the above-mentioned dry etching method, wherein a gas including a component as an etchant and a component for generating a deposition component by reaction is used as the etching gas in the first etching step.

The present invention provides the above-mentioned dry etching method, wherein the etching gas of the first etching step includes a CF-based gas and an N-based gas.

The present invention provides a dry etching method for etching using plasma a sample wafer having formed on a silicon substrate a mask pattern having at least a single layer and including an isolated portion and a dense portion, the method comprising performing, using a dummy wafer having a mask pattern similar to that of the sample wafer, a first etching process in which a anti-micro loading effect occurs where an etching rate of the dense portion of the pattern is greater than an etching rate of the isolated portion of the pattern, and acquiring a data on the etching rate of the dense portion of the pattern and the etching rate of the isolated portion of the pattern according to the first etching step, a step of performing a second etching process in which a micro loading effect occurs where the etching rate of the dense portion of the pattern is smaller than the etching rate of the isolated portion of the pattern, and acquiring a data on the etching rate of the dense portion of the pattern and the etching rate of the isolated portion of the pattern according to the second etching step, a step of computing a processing time of the first etching step and a processing time of the second etching step so that an isolated-dense bias becomes a desired value using the data obtained by the first etching step and the data obtained by the second etching step, and subjecting the sample wafer to an etching process in which the anti-micro loading effect occurs for the computed processing time of the first etching step, and to an etching process in which the micro loading effect occurs for the computed processing time of the second etching step.

DETAILED DESCRIPTION OF THE PREFERRED EMBODIMENTS

The present invention performs an etching process for processing an object to be etched having a profile that is easily affected by a micro loading effect, by adopting an etching step causing an effect opposite to the micro loading effect in which the etching rate of a dense portion is greater than the etching rate of an isolated portion (hereinafter referred to as anti-micro loading effect), and an etching step in which the micro loading effect occurs. The steps compensate for the portions in which the etching rate is small, so that a uniform etching profile across the isolated and dense portions can finally be obtained.

Embodiment 1

Figure 1:
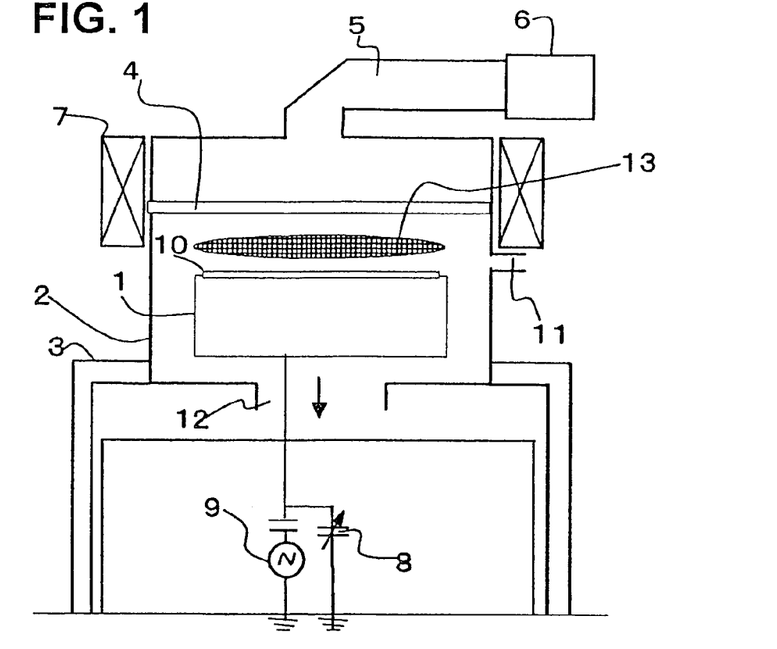
FIG. 1 is a schematic cross-sectional view showing one example of a plasma etching apparatus for performing a dry etching method according to the present invention.

Now, an embodiment according to the present invention will be described with reference to FIGS. 1 through 9. FIG. 1 is a schematic cross-sectional view showing one example of an etching apparatus for performing the dry etching method according to the present invention, which is a microwave plasma etching apparatus utilizing microwaves and magnetic fields as plasma generating means. In FIG. 1, the plasma etching apparatus comprises a sample stage 1 for placing thereon a sample wafer 10 which is the object to be processed, a vacuum reactor 2 having the sample stage 1 placed therein, a base 3 for supporting the vacuum reactor 2, a shower plate 4 disposed on an upper surface of the vacuum reactor 2, a waveguide 5 disposed above the shower plate 4, a magnetron 6 disposed on a leading end of the waveguide 5, a solenoid coil 7 disposed around the vacuum reactor 2, an electrostatic chuck power supply 8 connected to the electrostatic chuck disposed on the sample stage 1, and a high frequency power supply 9 connected to the sample stage 1.

In the plasma etching apparatus having the above-described structure, after a wafer 10 is carried into the vacuum reactor 2 through a wafer inlet port 11, DC voltage is applied to the electrostatic chuck disposed in the sample stage 1 from the electrostatic chuck power supply 8, so as to hold the wafer 10 via electrostatic chuck. Thereafter, processing gas is introduced into the vacuum reactor 2 via a shower plate 4. Further, the interior of the vacuum reactor 2 is evacuated via a vacuum pump (not shown) through an evacuation port 12 and controlled to a predetermined pressure (for example, between 0.1 and 10 Pa). Next, microwaves with a frequency of 2.45 GHz are supplied from a magnetron 6, which is propagated via the waveguide 5 into the vacuum reactor 2. In the vacuum reactor 2, the reaction between the microwaves propagated through the waveguide 5 and the magnetic field generated by the solenoid coil 7 excite the processing gas, generating plasma 13 in the space above the wafer 10.

On the other hand, a bias voltage is applied to the sample stage 1 via a high frequency power supply 9, by which the ions in the plasma 13 become perpendicularly incident on the wafer 10. Thereby, the reaction between the radicals and ions in the plasma 13 causes the wafer to be etched.

Figure 2:
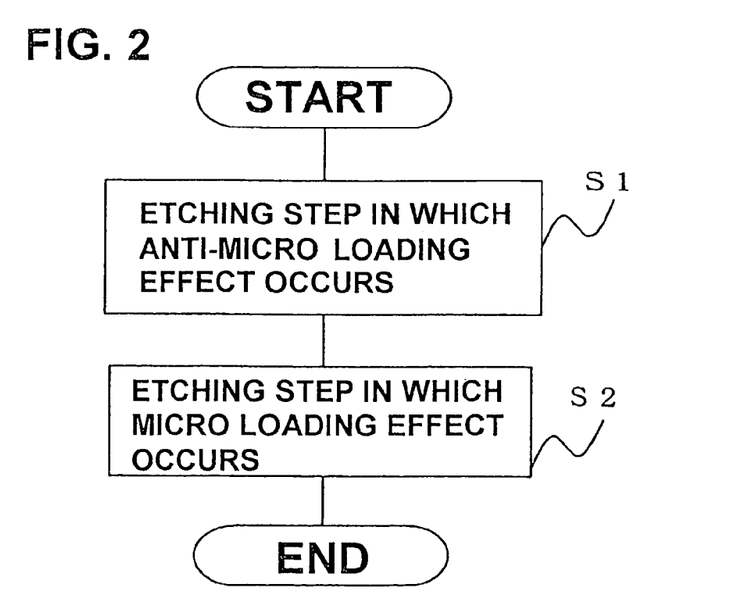
FIG. 2 is a flow chart showing a dry etching method according to one embodiment of the present invention.

Next, a dry etching method according to the present invention utilizing the plasma etching apparatus described above will be illustrated with reference to FIG. 2. FIG. 2 shows a process of a dry etching method according to one embodiment of the present invention. First, as a first step, an etching capable of causing an anti-micro loading effect is performed halfway through the wafer processing (step S1). Next, as a second step, an etching step capable of causing a micro loading effect is performed to the end of the wafer processing (step S2).

Further, according to the present invention, it is not necessary to perform the first etching step causing an anti-micro loading effect prior to the second etching step causing a micro loading effect, and the first etching step can be performed after the second etching step, or the first and second etching steps can be performed alternately for a number of times.

Now, the first etching step (S1) causing an anti-micro loading effect is performed as follows. In the plasma etching apparatus illustrated in FIG. 1, a mixed gas containing CF-based gas and nitrogen gas is supplied via the shower plate 4, so as to perform etching of the sample wafer 10. The etching conditions at this time is shown in table 1. $CF_4$ gas is used as the CF-based gas according to the present embodiment, but other CF-based gases such as $CHF_3$ can also be used instead of $CF_4$ gas, or a gas containing nitrogen atoms for bonding with carbon and generating cyanide compounds such as $NF_3$ can also be used. As for the CF-based gas, gases other than those mentioned above, such as $C_4F_8$, $C_4F_6$, $C_5F_8$, $CH_3F$, $CH_2F_2$ and $CHF_3$ containing atoms (C) reacting with nitrogen and generating deposition components (cyanide compounds: depositors) and components (F) generating radicals and ions to cause etching components (fluorine radicals: etchants) can also be used.

The etching conditions used in the first etching step will be shown in table 1.

TABLE 1

| Conditions of the first etching step of the present embodiment | |
|---|---|
| Processing pressure | 0.8 Pa |
| Wafer bias | 100 W (0.14 W/cm$^2$) |
| Microwave power | 800 W |
| CF$_4$ gas flow rate | 50 ml/min |
| Nitrogen gas flow rate | 10 ml/min |

Figure 3A:
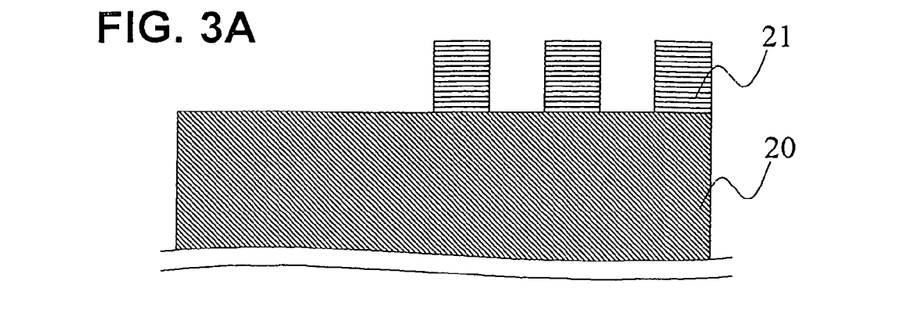
FIG. 3A is a vertical cross-sectional view of a silicon substrate showing the state prior to performing etching of an etching step in which a anti-micro loading effect occurs according to the present invention.

The etching state at this time will be described with reference to FIGS. 3A and 3B. FIG. 3A illustrates a structure of the sample wafer 10 prior to processing. A patterned mask 21 is disposed on a silicon substrate 20, and the pattern includes an isolated portion (isolated pattern portion) and a dense portion (dense pattern portion). Here, the mask 21 can either be a soft mask such as a photoresist or a hard mask such as a silicon nitride layer or a silicon oxide layer, or the mask can be composed of multiple layers.

The target value of etching quantity of the silicon substrate 20 and the setting of opening width of the dense portion according to the present invention are shown in table 2.

TABLE 2

| target value of silicon etching and opening width of dense portion | |
|---|---|
| Target value of silicon etching quantity | 300 nm |
| Opening width of dense portion | 30 nm |

Figure 3B:
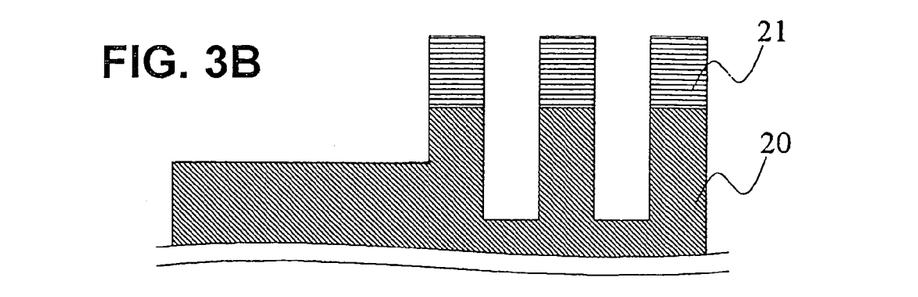
FIG. 3B is a vertical cross-sectional view of a silicon substrate showing the state after performing etching of the etching step in which a anti-micro loading effect occurs according to the present invention.

FIG. 3B illustrates a cross-sectional profile of the silicon substrate 20 having been etched halfway according to the conditions shown in table 1. The profile illustrated in FIG. 3B has two characteristic properties. The first property is that a deeper trench is formed in the dense portion of the pattern than in the isolated portion of the pattern. The reason for this phenomenon is that when etching is started, the $CF_4$ molecules and nitrogen within the plasma 13 react, generating cyanide compounds (depositors) as deposition components composed of nitrogen atoms and carbon atoms, and fluorine radicals (etchants) or fluorine ions (etchants) as etching components. When we compare fluorine radicals and cyanide compounds, if the deposition rate of the cyanide compounds is greater than the etching rate of fluorine radicals, etching will not be progressed at the wafer surface since cyanide compounds will be deposited, and especially, the deposition of cyanide compounds is greater at the isolated portion of the pattern than the dense portion of the pattern. If the effect of ion assisted etching such as via fluorine ions is added thereto, etching will be progressed both at the isolated and dense portions of the pattern, but since the ion assisted etching is easily blocked by the deposition of cyanide compounds at the isolated portion of the pattern, the etching will progress deeper and the etching rate will be greater in the dense portion of the pattern than in the isolated portion of the pattern. This is referred to as the anti-micro loading effect. Thus, the portions having a dense pattern portion is etched deeper compared to the isolated portion of the pattern.

The second characteristic property is that the nitrogen coats the surface of the silicon pattern and mainly the upper side walls of the groove with nitride, so that side etch is suppressed and the etching progresses with a desirable profile.

Table 3 shows the etching rate at the isolated portion and the dense portion of the pattern according to the first etching step.

TABLE 3

| etching rate of first etching step according to the present invention | |
|---|---|
| Etching rate of dense portion | 89.4 nm/min (1.49 nm/s) |
| Etching rate of isolated portion | 74.4 nm/min (1.24 nm/s) |

By etching a silicon wafer having a mask pattern including an isolated portion and a dense portion as shown in table 2 by the conditions of table 1, the etching rate of the dense portion of the pattern will be 89.47 nm/min (1.49 nm/s) and the etching rate of the isolated portion of the pattern will be 74.4 nm/min (1.24 nm/s), by which the anti-micro loading effect is caused.

Next, by etching the silicon wafer having the surface of the silicon pattern and mainly the upper side walls of the groove coated with nitride, a micro loading effect can be caused with no side etch. The second etching step is performed via the etching conditions shown in table 4.

TABLE 4

| Conditions of the second etching step of the present embodiment | |
|---|---|
| Processing pressure | 0.4 Pa |
| Wafer bias | 130 W (0.18 W/cm$^2$) |
| Microwave power | 900 W |
| HBr gas flow rate | 200 ml/min |
| Oxygen gas flow rate | 10 ml/min |
| Chlorine gas flow rate | 20 ml/min |

The etching state at this time is shown in FIGS. 4A and 4B. For comparison, the state prior to etching, which is the same as FIG. 3A, is shown in FIG. 4A. According to the etching conditions shown in table 4, a micro loading effect in which the portion where the pattern is isolated can be etched deeper than the portion where the pattern is dense is realized, so that by performing the present step after the first etching step, the effect operates to compensate for the isolated-dense bias caused in the first etching step. Here, the isolated-dense bias also referred to as ID bias is represented by the absolute value of the difference of etching quantity of the isolated portion of the pattern and the dense portion of the pattern.

Table 5 shows the etching rates of the isolated and dense portions according to the conditions of the second etching step shown in table 4.

TABLE 5

| Etching rates of the second etching step used in the present embodiment | |
|---|---|
| Etching rate of dense portion | 92.4 nm/min (1.54 nm/s) |
| Etching rate of isolated portion | 135.6 nm/min (2.26 nm/s) |

In other words, according to the second etching step under the present conditions, the etching rate of the dense portion of the pattern is 92.4 nm/min (1.54 nm/s) whereas the etching rate of the isolated portion of the pattern is 135.6 nm/min (2.26 nm/s), according to which a micro loading effect is caused.

By assuming that the etching rate of silicon is constant and does not vary with respect to the depth of the silicon, and by fixing the depth of the dense portion after etched to a target value of 300 nm, the depth of the isolated portion can be obtained via computation based on the results of table 3 and table 5. The result is shown in FIG. 6.

Figure 6:
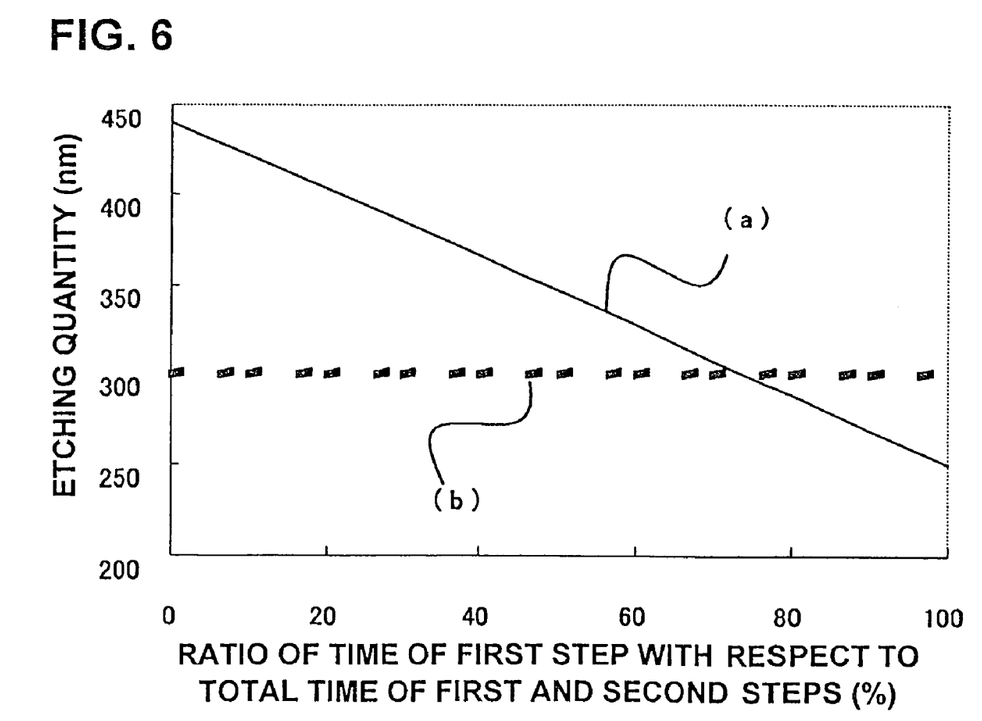
FIG. 6 is a correlation diagram showing the relationship between an etching quantity of the isolated and dense portions of the mask pattern predicted as an effect of the present invention and the ratio of etching time of the first step with respect to the total etching time of the first and second steps.

The horizontal axis of FIG. 6 represents the ratio of etching time of the first etching step with respect to the total etching time of the first and second etching steps. The vertical axis represents the predicted etching quantity of the dense portion of the pattern (b) and the etching quantity of the isolated portion of the pattern (a) when the etching is terminated. If the isolated portion and the dense portion of the pattern are both etched for 300 nm, it can be recognized that the ratio of etching time of the first etching step is 74.2%. The total time of the first and second etching steps for etching the dense portion for 300 nm can be computed as 200 seconds from the following expression; total time=300÷{1.49×0.742+1.54×(1−0.742)}. In other words, the time of the first etching step is 148 seconds and the time of the second etching step is 52 seconds.

However, during actual etching, the etching rate will become smaller as the depth of the silicon increases, so in consideration thereof, it might be better to extend the time by approximately 10%. In other words, the first etching step should be 163 seconds and the second etching step should be 57 seconds. The result of performing actual etching by the etching step time obtained as described above will be shown in table 6.

TABLE 6

| etching results | |
|---|---|
| Dense portion depth | 301 nm |
| Isolated portion depth | 299 nm |

In other words, the etching depth of the dense portion of the pattern is 301 nm whereas the etching depth of the isolated portion of the pattern is 299 nm, according to which the isolated-dense bias is 2 nm, and the ratio of the isolated-dense bias with respect to the etching depth is 0.7%, meaning that a highly accurate etching is performed. Thus, according to the present invention, the isolated-dense bias is improved, and a preferable profile can be obtained.

According to the description, the present embodiment is aimed at eliminating isolated-dense bias, but if it is desirable to provide an isolated-dense bias of a predetermined range, it is possible to estimate the etching rate according to a method similar to the present embodiment, to determine the time distribution of the first and second etching steps for realizing the desirable isolated-dense bias, and to perform the present invention.

The present invention is not restricted to the conditions described above, and the present invention enables to determine the relationship between the first and second etching steps and to perform the etching process with a most suitable isolated-dense bias even if etching conditions such are changed, such as by using other combination of gases.

Figure 7:
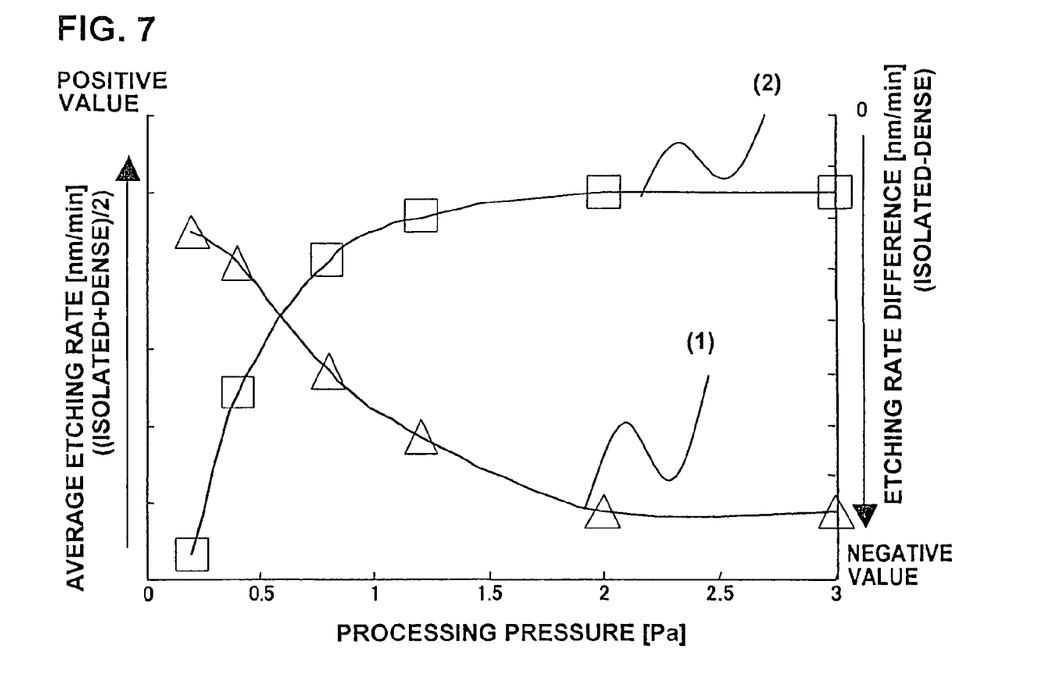
FIG. 7 is a correlation diagram showing the relationship between the anti-micro loading effect and the processing pressure thereof according to the dry etching method of the present invention.
Figure 8:
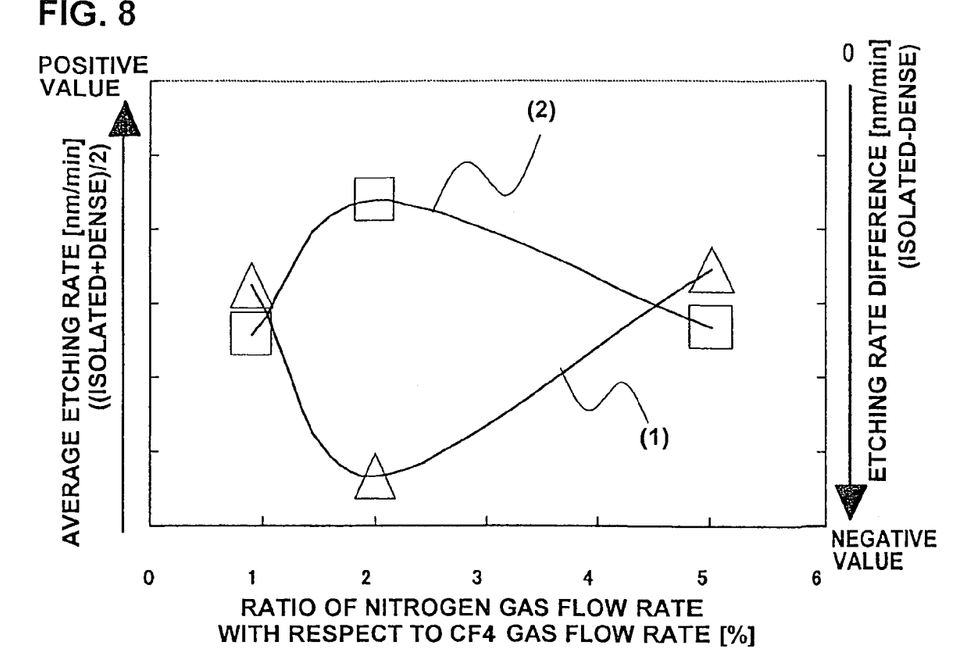
FIG. 8 is a correlation diagram showing the relationship between the anti-micro loading effect and the nitrogen gas flow ratio according to the dry etching method of the present invention.
Figure 9:
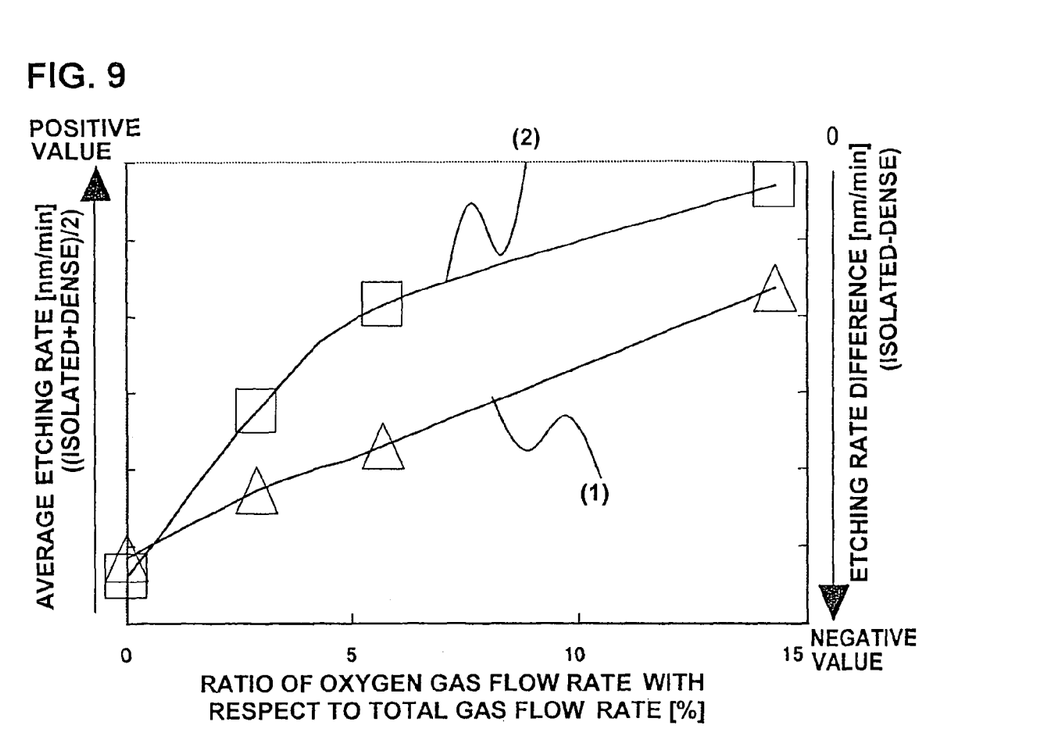
FIG. 9 is a correlation diagram showing the relationship between the anti-micro loading effect and the oxygen gas flow ratio according to the dry etching method of the present invention.

Next, with reference to FIGS. 7 through 9, the correlation of etching conditions realizing an anti-micro loading effect will be described. In FIGS. 7 through 9, curve (1) represents the difference value of etching rate of silicon at the isolated portion of the pattern and the etching rate of silicon at the dense portion of the pattern (that is, the etching rate of silicon at the isolated portion of the pattern–the etching rate of the dense portion of the pattern), and refers to the right vertical axis. Curve (2) represents the average value of etching rate of silicon at the isolated portion and the dense portion of the pattern (that is, (etching rate of silicon at the isolated portion of the pattern+etching rate of dense portion of the pattern)/2), and refers to the left vertical axis.

The profile formed via the anti-micro loading effect can be subjected to comparative evaluation via similarity relationship based on the ratio of the difference value of the etching rates and the average value of the etching rates.

FIG. 7 shows the result of examining the anti-micro loading effect and the processing pressure dependency thereof. This shows the variation of the difference value and the average value of etching rates of silicon at the isolated and dense portions when the wafer bias, the microwave power, the flow rate of $CF_4$ gas and the flow rate of nitrogen gas are fixed, and the processing pressure is varied (refer to the horizontal axis), taking the conditions of table 1 as reference. The processing pressure is varied between 0.1 Pa and 3.0 Pa during measurement.

FIG. 8 shows the result of examining the anti-micro loading effect and the nitrogen gas flow rate dependency thereof. This shows the variation of the difference value and the average value of etching rates of silicon at the isolated and dense portions when the processing pressure, the wafer bias, the microwave power and the total flow rate of the whole gas are fixed, and the ratio of flow rate of nitrogen gas with respect to the flow rate of $CF_4$ gas is varied (refer to the horizontal axis), taking the conditions of table 1 as reference. That is, according to the processing conditions of table 1, the difference of etching rates is increased to the negative side as the processing pressure is increased, and the effect of anti-micro loading becomes significant.

FIG. 9 shows the result of examining the anti-micro loading effect and the oxygen gas flow rate dependency. This shows the variation of the difference value and the average value of etching rates of silicon at the isolated and dense portions when the processing pressure, the wafer bias, the microwave power, the total flow rate of the whole gas and the ratio of flow rate of $CF_4$ gas and nitrogen gas are fixed, wherein oxygen gas is added thereto and the ratio of flow rate of oxygen gas with respect to the flow rate of the total gas is varied (refer to the horizontal axis for oxygen gas flow ratio), taking the conditions of table 1 as reference. That is, in this case, the difference of etching rates is increased to the negative side when the flow ratio of nitrogen gas with respect to $CF_4$ gas is set to substantially 20%, and the difference of etching rates is reduced when the flow rate is above or below that value.

Based on these results, it can be seen that according to the anti-micro loading effect and the pressure dependency thereof shown in FIG. 7, the anti-micro loading effect is strong when pressure is high. The reason for this is considered to be that since the absolute amount of deposition of cyanide compounds is increased as the pressure increases, the isolated portion of the pattern is further resistant to etching compared to the dense portion of the pattern. As a result, it is recognized that the anti-micro loading effect at least occurs when the pressure is between 0.2 and 3.0 Pa.

According to the anti-micro loading effect and the nitrogen gas flow ratio dependency of FIG. 8, it is considered that the flow ratio should preferably be around approximately 20% with respect to the flow rate of $CF_4$ gas for the best conditions. In the area where the condition is not best and the nitrogen gas flow rate is small, the amount of deposition of cyanide compounds is small and the anti-micro loading effect is weakened, while on the other hand, in the area where the nitrogen gas flow rate is high, cyanide compounds are deposited sufficiently even in the dense portion and the overall etching rate of silicon is reduced. Based on the results, it is recognized that the anti-micro loading effect at least occurs when the nitrogen gas flow rate is 10 to 50% with respect to the $CF_4$ gas flow rate.

According to the anti-micro loading effect and the oxygen gas flow ratio dependency of FIG. 9, the etching rate of silicon is increased both in the isolated and dense portions of the pattern when oxygen gas is added, but the anti-micro loading effect is weakened. This is considered to be caused by the $CF_4$ reacting not only with nitrogen but also with oxygen, generating fluorine radicals or fluorine ions, by which the etchants are increased with respect to the depositors of cyanide compounds (the CO-based molecules formed by the reaction of carbon and oxygen is highly volatile and will not become depositors). The etching rate is too small by merely using $CF_4$ gas and nitrogen gas, and a problem may occur to the throughput. A possible solution to the problem is the injection of oxygen gas, but as can be seen from this result, the adding of oxygen gas increases the etching rate but weakens the anti-micro loading effect. This property should be taken into consideration when actually applying the present invention. Oxygen gas is adopted according to the present embodiment, but the same tendency can be seen by adopting a gas containing oxygen atoms instead of using oxygen gas. In consideration of the result and the cause thereof, it can be recognized that the anti-micro loading effect at least occurs when the flow rate of oxygen gas is not above the nitrogen gas flow rate.

Based on the above results, it can be recognized that the most preferable conditions for drawing out the anti-micro loading effect are high pressure with the flow rate of nitrogen gas being approximately around 20% with respect to the $CF_4$ gas flow rate.

According to the present embodiment, the isolated-dense bias with respect to the depth can be controlled to a predetermined value by assembling the silicon etching step using a gas containing $CF_4$ gas, nitrogen gas and oxygen gas (first etching step) and the silicon etching step using halogen-based gas (second etching step), and further selecting the etching time ratio of the two steps, according to which the isolated-dense bias can be solved.

As described, the present invention provides a dry etching method for etching using plasma a sample wafer having a mask pattern composed at least of a single layer and including an isolated portion and a dense portion disposed on a silicon substrate, the method comprising performing, using a dummy wafer having a similar mask pattern as the sample wafer, a first etching process in which an anti-micro loading effect occurs where the etching rate of a dense portion of the pattern is greater than the etching rate of an isolated portion of the pattern, acquiring data of the etching rate of the dense pattern portion and the etching rate of the isolated pattern portion according to the first etching step, performing a second etching process for generating a micro loading effect in which the etching rate of the dense pattern portion of the pattern is smaller than the etching rate of the isolated pattern portion, acquiring data of the etching rate of the dense pattern portion and the etching rate of the isolated pattern portion according to the first etching step, computing the processing time of the first etching step and the processing time of the second etching step so that an isolated-dense bias is set to a desirable value using the data obtained by the first etching step and the data obtained by the second etching step, performing an etching process causing the anti-micro loading effect to the sample wafer for the computed processing time of the first etching step, and performing an etching process causing the micro loading effect for the computed processing time of the second etching step, thereby controlling the isolated-dense bias to a predetermined value.

The etching gas used for the first etching step according to the present dry etching method can be a mixed gas containing CF-based gas and nitrogen, and the mixed gas can further contain oxygen atoms. Further according to the first etching step, the flow rate of nitrogen atom-containing gas is controlled to fall within the range of 10 to 50% of the CF-based gas flow rate, and the flow rate of gas containing oxygen atoms is controlled to fall below the nitrogen gas flow rate. The processing pressure according to the first etching step is controlled within the range of 0.2 to 3 Pa. The first etching step and the second etching step can be performed alternately. Further according to the present invention, halogen gas can be used in the second etching step.

What is claimed is:

1. A dry etching method for plasma etching a sample wafer, the sample wafer having a silicon substrate and a mask pattern on the silicon substrate, the mask pattern having at least a single layer and including an isolated portion and a dense portion, the method comprising:

a first etching step in which an etching rate of the dense portion of the mask pattern is greater than an etching rate of the isolated portion the etching rate of the isolated portion of the mask pattern; and a second etching step in which the etching rate of the isolated portion of the mask pattern is greater than the etching rate of the dense portion of the mask pattern, wherein the first etching step uses a mixed gas composed of a CF-based gas and nitrogen gas; and wherein an etching time ratio of the first etching step and the second etching step is controlled so that an absolute value of the difference of an etching depth of the isolated portion and the dense portion of the mask pattern is set to a predetermined value.

2. The dry etching method according to claim 1, wherein the first etching step uses a mixed gas composed of a CF-based gas, nitrogen gas and a gas containing oxygen atoms.

3. The dry etching method according to claim 2, wherein the flow rate of the nitrogen gas is controlled to fall within a range of 10 to 50% of the flow rate of the CF-based gas.

4. The dry etching method according to claim 2, wherein the flow rate of the gas containing oxygen atoms is controlled to be equal to or smaller than the flow rate of the nitrogen gas.

5. The dry etching method according to claim 1, wherein the processing pressure according to the first etching step is controlled to fall within a range of 0.2 to 3 Pa.

6. The dry etching method according to claim 2, wherein the processing pressure according to the first etching step is controlled to fall within a range of 0.2 to 3 Pa.

7. The dry etching method according to claim 1, wherein the first etching step is an etching step in which an anti-micro loading effect occurs;

the second etching step is an etching step in which a micro loading effect occurs; and the first etching step and the second etching step are performed alternately.

8. The dry etching method according to claim 1, wherein the second etching step is an etching step using halogen gas.

9. The dry etching method according to claim 3, wherein said gas containing oxygen atoms is oxygen gas.

* * * * *